United States Patent [19]

Gulick et al.

[11] Patent Number: 5,220,601
[45] Date of Patent: Jun. 15, 1993

[54] KEYPAD STATUS REPORTING SYSTEM

[75] Inventors: Dale E. Gulick; Alan R. Hendrickson, both of Tex.

[73] Assignee: Advanced Micro Devices, Inc., Sunnyvale, Calif.

[21] Appl. No.: 589,065

[22] Filed: Sep. 27, 1990

[51] Int. Cl.$^5$ ................................. G06F 3/02
[52] U.S. Cl. ................................. 379/368; 379/359; 341/22; 341/24; 341/26
[58] Field of Search ............ 341/24, 25, 26, 22; 379/359, 360, 361, 362, 364, 365, 368

[56] References Cited

U.S. PATENT DOCUMENTS

| | | | |
|---|---|---|---|
| 3,928,847 | 12/1975 | Spence | 341/24 |
| 4,086,588 | 4/1978 | Kawanabe et al. | 341/24 |
| 4,318,087 | 3/1982 | Wilson | 341/26 |
| 4,346,369 | 8/1982 | Macy | 341/24 |
| 4,390,754 | 6/1983 | Holberg | 341/26 |
| 4,414,538 | 11/1983 | Schnizlein | 341/26 |
| 4,554,530 | 11/1985 | Mussmann | 341/26 |
| 4,821,033 | 4/1989 | Mori et al. | 341/24 |
| 5,025,255 | 6/1991 | Mould | 341/22 |

Primary Examiner—James L. Dwyer
Assistant Examiner—M. G. Shehata
Attorney, Agent, or Firm—Foley & Lardner

[57] ABSTRACT

A keypad status reporting system provides an indication over a serial bus as to which switch of a plurality of keypad switches is being selected by an operator wherein each keypad switch is coupled between a respective different pair of row and column conductors. The system generates parallel three-bit row and column addresses, combines the row and column addresses to form a parallel six-bit key code, and converts the key code to serial bits of data and places the serial bits of data onto a multiplexed bus in a predetermined channel.

19 Claims, 6 Drawing Sheets

KEYPAD STATUS REPORTING SYSTEM

BACKGROUND OF THE INVENTION

The present invention generally relates to a keypad status reporting system and more particularly to such a system wherein keypad status is reported over a serial bus. The present invention still more particularly relates to such a system wherein a keypad monitor provides a unique parallel multiple-bit key code indicative of a selected keypad switch and wherein a parallel to serial converter converts the parallel key code to serial bits of data and places the serial bits of data into a predetermined channel onto a multiplexed bus. The keypad status reporting system of the present invention as disclosed herein may be used to advantage in a hands-free, multiple feature telephone unit incorporated into a single integrated circuit and adapted for use in an Integrated Services Digital Network (ISDN).

Keypads and monitors associated therewith are well known in the art. Such keypads generally include an array of switches with each switch coupled between a respective different pair of first and second conductors. When a keypad switch is depressed or otherwise selected, a condition can then be sensed across the first and second conductors to which a particular switch is coupled to identify which switch is being depressed. Such condition sensing is performed by the keypad monitor.

Keypad monitors for identifying a particular keypad switch being selected have been implemented in integrated circuit form. The keypad monitors of such integrated circuits generally include a first plurality of inputs arranged to be coupled to the first keypad conductors and a second plurality of inputs arranged to be coupled to the second keypad conductors. The keypad monitors further generally include internal circuitry which scan the first and second plural inputs for detecting the closure of a keypad switch.

One dominant application for keypads and keypad monitors is in telephone equipment. Keypads are used in such applications for dialing telephone numbers or selecting various features provided by a particular piece of telephone equipment. Such features may include call transfer, call conference, hold, or multiple-line selection, for example.

Keypad monitors generally report the status of the keypad switch using a parallel multiple-bit format. This is acceptable when the keypad monitor is not integrated with other circuitry requiring integrated circuit terminal pins. However, if the keypad monitor is integrated with other circuitry requiring integrated circuit terminal pins, the cost of such an integrated circuit can be prohibitive. This is the direct result of the economic fact that in the integrated circuit industry, the cost of producing an integrated circuit is strongly dependent upon the number of terminal pins required to be incorporated into the device package. If the keypad monitor is to report the keypad switch status with a parallel six-bit key code, six terminal pins would be required for the keypad status reporting alone. Hence, in the past, the amount of other circuitry which could be integrated with a keypad monitor has been extremely limited.

SUMMARY OF THE INVENTION

The invention therefore provides a keypad status reporting system implemented in a single integrated circuit for providing an indication over a multiplexed bus as to which switch of a plurality of keypad switches is being selected by an operator. Each keypad switch is coupled between a respective different pair of a plurality of first and second conductors.

The system includes monitor means coupled to the first and second conductors for providing first and second signals indicative of a selected keypad switch, encoding means coupled to the monitor means for generating a unique parallel multiple-bit address responsive to the first and second signals, and parallel to serial conversion means coupled to the encoding means for converting the parallel multiple-bit address to corresponding serial bits of data. The conversion means also includes an enable input and is responsive to an enable signal at the enable input for placing the serial bits of data onto the serial bus in a predetermined channel of the multiplexed bus.

The invention further provides a keypad status reporting system for providing an indication over a serial bus as to which switch of a plurality of keypad switches is being selected by an operator, wherein each keypad switch is coupled between a respective different pair of first and second conductors. The system includes first input circuit means coupled to the first conductors for providing a first signal indicating which one of the first conductors is coupled to the selected keypad switch, second input circuit means coupled to the second conductors for providing a second signal indicating which one of the second conductors is coupled the selected keypad switch, and encoding means coupled to the first and second input circuit means for providing a unique parallel multiple-bit digital key code indicating which one of the keypad switches is being selected. The system further includes parallel to serial conversion means coupled to the serial bus and to the encoding means for converting the parallel multiple-bit digital key code to serial bits of data and conveying the serial bits of data to the serial bus.

The invention still further provides a keypad status reporting system for providing an indication over a serial bus as to which switch of a plurality of keypad switches is being selected by an operator, wherein each keypad switch is coupled between a respective different pair of a plurality of row and column conductors, and wherein the system is implemented in integrated form. The system includes row input circuit means coupled to the row conductors for providing a first signal indicating which of the first conductor is coupled to the selected keypad switch, column input circuit means coupled to the column conductors for providing a second signal indicating which one of the column conductors is coupled to the selected keypad switch, row encoding means coupled to the row input circuit means for generating a parallel multiple-bit row address responsive to the first signal, and column encoding means coupled to the column input circuit means for generating a parallel multiple-bit column address responsive to the second signal. The system further includes parallel to serial conversion means coupled to the row encoding means and the column encoding means for combining the row and column addresses to form a parallel multiple-bit key code, the conversion means also being coupled to the serial bits and being arranged for converting the parallel multiple-bit key code to serial bits of data and conveying the serial bits of data to the serial bus.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings in the several figures of which like reference numerals identify identical elements and wherein:

DESCRIPTION OF THE PREFERRED EMBODIMENT

Figure 1:
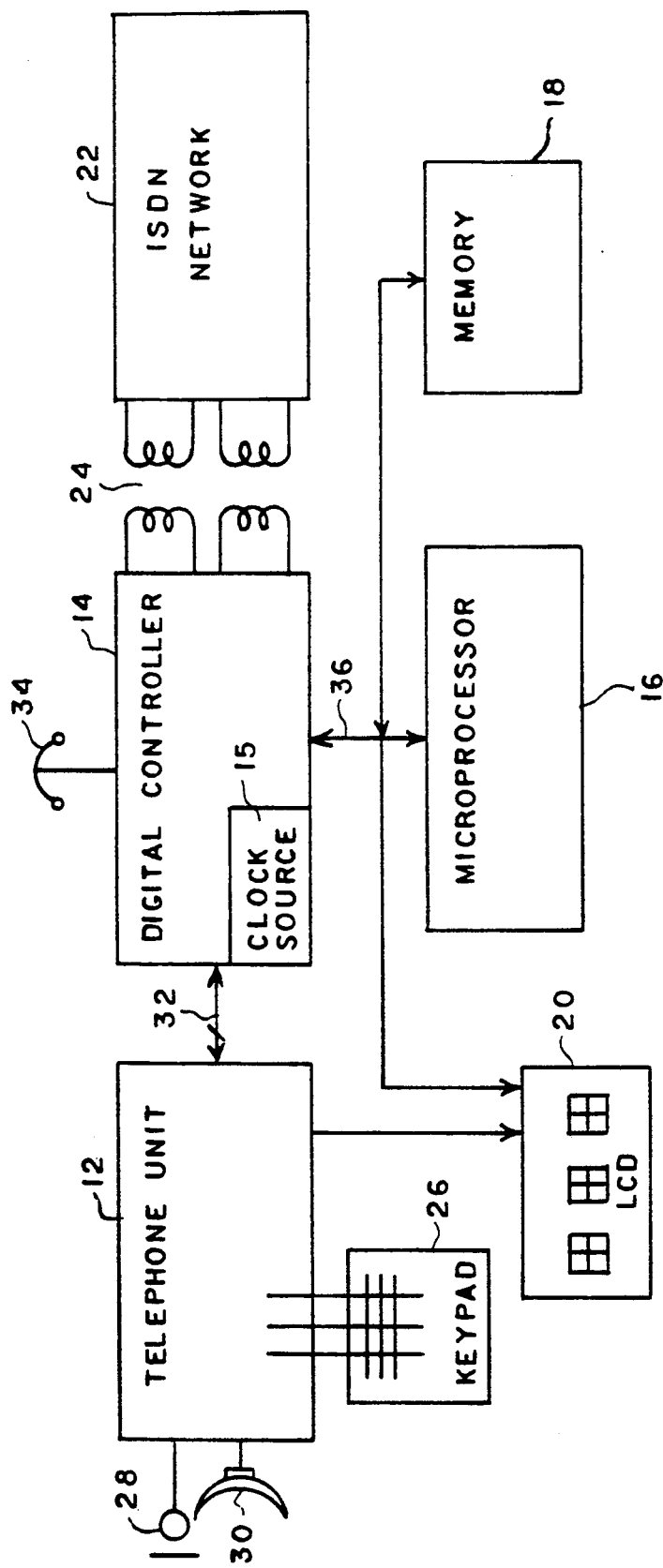
FIG. 1 is a block diagram of an ISDN telephone system including an ISDN hands-free, multiple feature telephone unit embodying the present invention.

Referring now to FIG. 1, it illustrates in block diagram form, an ISDN telephone system 10 embodying the present invention. The system 10 generally includes a hands-free, multiple feature telephone unit 12, a digital controller 14, a microprocessor 16, a memory 18, and a liquid crystal display unit 20. The system 10 is transformer-coupled to an ISDN network 22 by a transformer 24.

The telephone unit 12 is coupled to a keypad 26 in a manner to be described in greater detail hereinafter. To that end, as will also be seen hereinafter, the unit 12 includes a keypad monitor embodying the present invention for monitoring the keypad switches of the keypad to first detect when any one of the keypad switches is closed to obtain clock signals from an external clock source and then to identify and report the identity of a particular key being selected. Selection of the keys of the keypad 26 may be made for dialing a telephone number or for selecting a particular feature of the telephone unit 12. Also coupled to the unit 12 is a microphone 28 which serves to convert audible speech to analog voltage form and a loudspeaker 30 which serves to convert analog voltages representative of human speech to audible sound. The microphone 28 and speaker 30 may, of course, be contained in the same housing as the telephone unit 12. As will also be seen hereinafter, the telephone unit 12 includes an audio processor which converts the analog voltages produced by the microphone 28 representative of audible speech to output digital signals and which also converts input digital signals representative of human speech to analog voltages for conversion to audible sound by the speaker 30.

The telephone unit 12 is coupled to the digital controller 14 by a four-conductor bus 32. The bus 32 is preferably of the type well known in the art as an IOM-2 bus (IOM is a trademark of Siemens AG). The bus will be described in greater detail with respect to FIG. 2. It basically provides a serial digital interface between the telephone unit 12 and the digital controller 14.

The digital controller 14 provides a digital interface between the telephone unit 12 and the bus 32 to the ISDN network 22 and the microprocessor 16. The digital controller is preferably the Am79C30A Digital Subscriber Controller available from Advanced Micro Devices, Inc., the assignee of the present invention, and is well known in the art. It provides, in addition to the digital interface function, a CODEC transceiver function to support the use of a standard telephone handset 34 coupled thereto to enable the telephone user to communicate over the ISDN network 22 from the standard handset 34. It also includes a clock source 15 for providing clock signals to the telephone unit 12 in response to receiving an activation signal from the telephone unit 12.

The microprocessor 16 is coupled to the digital controller 14 over a microprocessor bus 36 which also couples the microprocessor to the memory 18 and the liquid crystal display unit 20. The microprocessor 16 executes programs stored in the memory 18 and thus provides the intelligence of the system 10. The microprocessor 16 allows the telephone system 10 to perform the functions customarily performed by such systems. It also responds to requests for service by the telephone user when the telephone user takes the telephone handset 34 off-hook or when the telephone user activates the telephone unit 12 in a manner to be described hereinafter by depressing one of the keys of the keypad 26. Such microprocessors and the programs which they execute are also well known in the art.

The liquid crystal display unit 20 is coupled to the telephone unit 12 and the digital controller 14. It functions to provide a display of, for example, a telephone number being dialed, the telephone number of an incoming call or an indication of various telephone unit features selected by the user such as hands-free, hold, speaker mute, et cetera.

Figure 2:
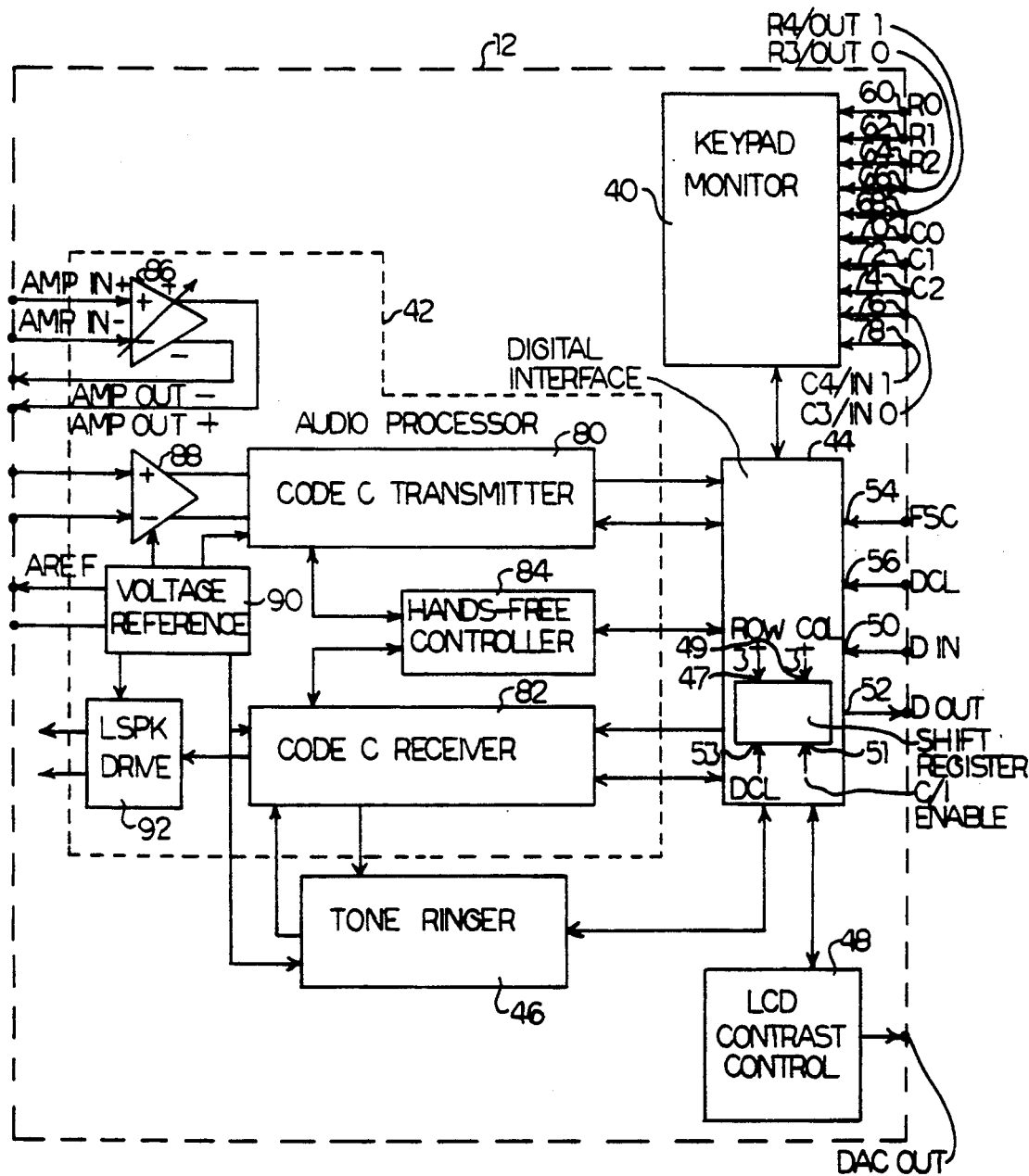
FIG. 2 is a block diagram of the hands-free, multiple feature telephone unit of FIG. 1 embodying the present invention.

Referring now to FIG. 2, it illustrates the telephone unit 12 in greater detail. The telephone unit 12 generally includes the keypad monitor 40 embodying the present invention, an audio processor 42, a digital interface 44, a tone ringer 46, and a liquid crystal display contrast control 48. The functional units of the telephone unit 12 are all integrated into a single integrated circuit chip to form the telephone unit 12.

The digital interface 44 provides a serial digital interface between the functional modules of the telephone unit 12 and the digital controller 14 over the four-conductor bus 32. The digital interface 44 includes an input 50 for receiving serial digital data from the digital controller 14 and an output 52 for conveying serial digital data to the digital controller 14. The digital data is conveyed between digital interface 44 of the telephone unit 12 and the digital controller 14 using a multiplexed channel comprising three repetitively conveyed thirtytwo bit frames. The frame structure is well known in the art. Each frame comprises a plurality of channels which include serial digital representations of received or transmitted speech, data to be entered into register, data to be read from register, register addresses, keypad information such as a six-bit indication of a particular key being depressed, and other control information.

To provide synchronization for the data transfer, the digital interface 44 includes another input 54 (FSC) for receiving frame synchronizing signals at an 8 kilohertz rate from the digital controller 14 and an input 56 (DCL) for receiving clock signals at a 1.536 megahertz rate from the digital controller 14 for synchronizing the transmission and the reception of the individual bits of data and for causing the keypad monitor 40 to scan its inputs to identify a closed keypad switch.

In keeping with strict power requirements for such telephone units when not in use, the telephone unit 12 is in a deactivated state when not in use for conserving power. When no data is being transferred between the telephone unit 12 and the digital controller 14 or when the telephone unit 12 is otherwise deactivated, the data output 52 is held high. The telephone unit 12 is activated when any one keypad switch of the keypad is depressed or closed causing the keypad monitor 40 to provide an activation signal referred to as an any key down indication. This causes the data output 52 to be pulled low to in turn cause the digital controller 14 to provide the aforementioned clock signals from its clock source 15. Upon receipt of the clock signals, the telephone unit 12 is activated permitting the keypad monitor to scan its input terminals to determine which key is depressed. Hence, at any time data is to be transferred from the keypad 26 to the digital controller 14, the data output 52 is momentarily pulled low to cause the digital controller to provide the clock signals from its clock source 15.

The keypad monitor 40 includes a first plurality of inputs coupled to input terminal pins 60, 62, 64, 66 and 68 which are arranged to be coupled to a first plurality of keypad switch conductors (row conductors) and a second plurality of inputs coupled to input terminal pins 70, 72, 74, 76 and 78 which are arranged to be coupled to a second plurality of keypad switch conductors (column conductors). Since there are five inputs for row conductors and five inputs for column conductors, the keypad monitor, when operative in a first mode, is capable of monitoring a first set of input terminals including all of the input terminals and thus, is capable of monitoring a full-sized keypad comprising twenty-five keypad switches.

When the keypad monitor 40 is operative in a second mode, the keypad monitor monitors a second set of input terminals, namely, input terminals 60, 62, 64, 70, 72 and 74. Hence, in the second mode, there are three row inputs and three column inputs for monitoring a keypad comprising nine keypad switches. Also, when the keypad monitor is in the second mode, terminal pins 66 and 68 are converted to general outputs, not associated with keypad monitoring, and terminal pins 76 and 78 are converted to general inputs, also not associated with keypad monitoring. As a result, when in the second mode, a third set of terminal pins comprising terminal pins 66, 68, 76, and 78 are not needed for keypad monitoring but are converted to other uses to make full utilization of all of the integrated circuit terminal pins.

Each keypad switch is coupled between a respective different pair of row and column conductors. When a keypad switch is depressed or closed, the keypad monitor 40, after providing the aforementioned any key down indication and receiving the clock signals from the digital controller 14, then scans the input terminals and senses for a condition which indicates which keypad switch is closed. After detecting which keypad switch is closed, the monitor pauses to account for key bounce and then in accordance with the present invention, generates a parallel three-bit row address and a parallel three-bit column address representative of the keypad switch which is closed. The row and column addresses are then conveyed to a parallel input-serial output shift register 45 of the digital interface 44.

The parallel three-bit row address is impressed upon input 47 of the shift register 45 and the parallel three-bit column address is impressed upon input 49 of the shift register 45. The parallel three-bit addresses at inputs 47 and 49 are then combined by the shift register 45 to form a complete and unique six-bit address for the keypad switch being selected. The address remains in the shift register 45 until an enable signal is received by the shift register at an enable input 51.

In accordance with this preferred embodiment, the six-bit address is conveyed to the digital controller 14 within the C/I channel of the IOM TM-2 multiplexed bus 32. The shift register 45 converts the parallel six-bit key code into serial bits of data and places the serial bits of data from output 52 onto the bus within the C/I channel upon receipt of the C/I enable signal generated by the digital interface in a known manner. Upon receiving the C/I enable signal, the shift register 45 clocks each address bit one at a time onto the bus synchronized to the DCL clock signals received at input 53.

As will be seen hereinafter, the keypad monitor 40 includes a state control which sequences the keypad monitor through repetitive cycles of operation when the keypad monitor is activated. During the next keypad monitor cycle, if the same key is still depressed, the shift register 45 will once again receive the same three-bit row and column addresses. However, if no key is depressed, the shift register will receive a predetermined parallel six-bit key code (three bits at input 47 and three bits at input 49) representative of a no key down condition to be conveyed over the bus in the C/I channel. The no key down code is the idle code for the C/I channel and is preferably in the form of 111111.

As will be seen hereinafter, the state control of the keypad monitor 40 is also responsive to two or more keypad keys being simultaneously depressed to generate an error signal. The error signal is conveyed to the shift register 45 as a keycode comprising a predetermined parallel six-bit error key code. The error key code is shifted in series onto the bus within the C/I channel upon receipt of the C/I enable signal. The error key code informs the rest of the system that the keypad entry is an invalid entry and should be ignored.

The audio processor 42 includes a CODEC transmitter 80, a CODEC receiver 82, a hands-free controller 84, a variable gain amplifier 86, a fixed gain amplifier 88, a voltage reference 90, and a loudspeaker drive 92. The audio processor 42 thus provides all of the audio processing within the telephone unit 12.

The CODEC transmitter 80 receives analog voltages representative of audible speech from the fixed gain amplifier 88. The fixed gain amplifier 88 includes a pair of inputs which may be directly coupled to an external microphone or coupled to the external microphone through the variable gain amplifier 86. Preferably, the microphone is capacitively coupled to the telephone unit 12 at the inputs of either the variable gain amplifier 86 or the fixed gain amplifier 88. If the variable gain amplifier 86 is utilized, its outputs should preferably be capacitively coupled to the inputs of the fixed gain amplifier 88 through external capacitors.

The CODEC transmitter 80 after receiving the audio voltages representative of human speech, digitizes the analog voltages into an 8-bit digital word and conveys the same to the digital interface 44. The digital interface 44 then serializes the digital word received from the CODEC transmitter and places the same into the appropriate channel for transmission to the digital controller from the output 52.

The CODEC receiver 82 includes a digital-to-analog converter which converts the 8-bit digital words received from the digital interface 44 representative of received human speech and converts the same to analog voltages. The received audio is received by the digital interface 44 at input 50 in serial bit format and converts the same to 8-bit parallel bit words for conversion to analog form by the CODEC receiver 82. The CODEC receiver 82 is coupled to the loudspeaker drive 92 which includes an amplifier for amplifying the analog voltages representative of received human speech. The loudspeaker drive 92 is adapted to be coupled to the external speaker 30 (FIG. 1) for reproducing the received audio.

The tone ringer 46 is coupled to the CODEC receiver 82. The tone ringer provides ringing tones in digital format which are also converted to analog form by the CODEC receiver. The analog voltages representative of the ringing tones are then conveyed to the loudspeaker drive 92 for reproduction by the external speaker coupled to the loudspeaker drive 92. The tone ringer 46 is preferably programmable by a register contained within the tone ringer 46 and which may be programmed by the microprocessor to permit a plurality of different distinguishable rings to be produced by the tone ringer 46.

Lastly, the liquid crystal display contrast control 48 provides an output voltage for the liquid crystal display to adjust the contrast thereof. The liquid crystal display contrast control 48 is coupled to the digital interface 44 and is controllable by a register within the contrast control 48 which may be programmed through the 4-conductor bus 32.

The hands-free controller 84 is coupled between the CODEC transmitter 80 and CODEC receiver 82. The hands-free controller 84 controls the enablement of the CODEC transformer and CODEC receiver to provide hands-free simplex operation of the telephone unit 12. The hands-free controller 84 is coupled to the digital interface 44 for receiving control signals therefrom.

Figure 3:
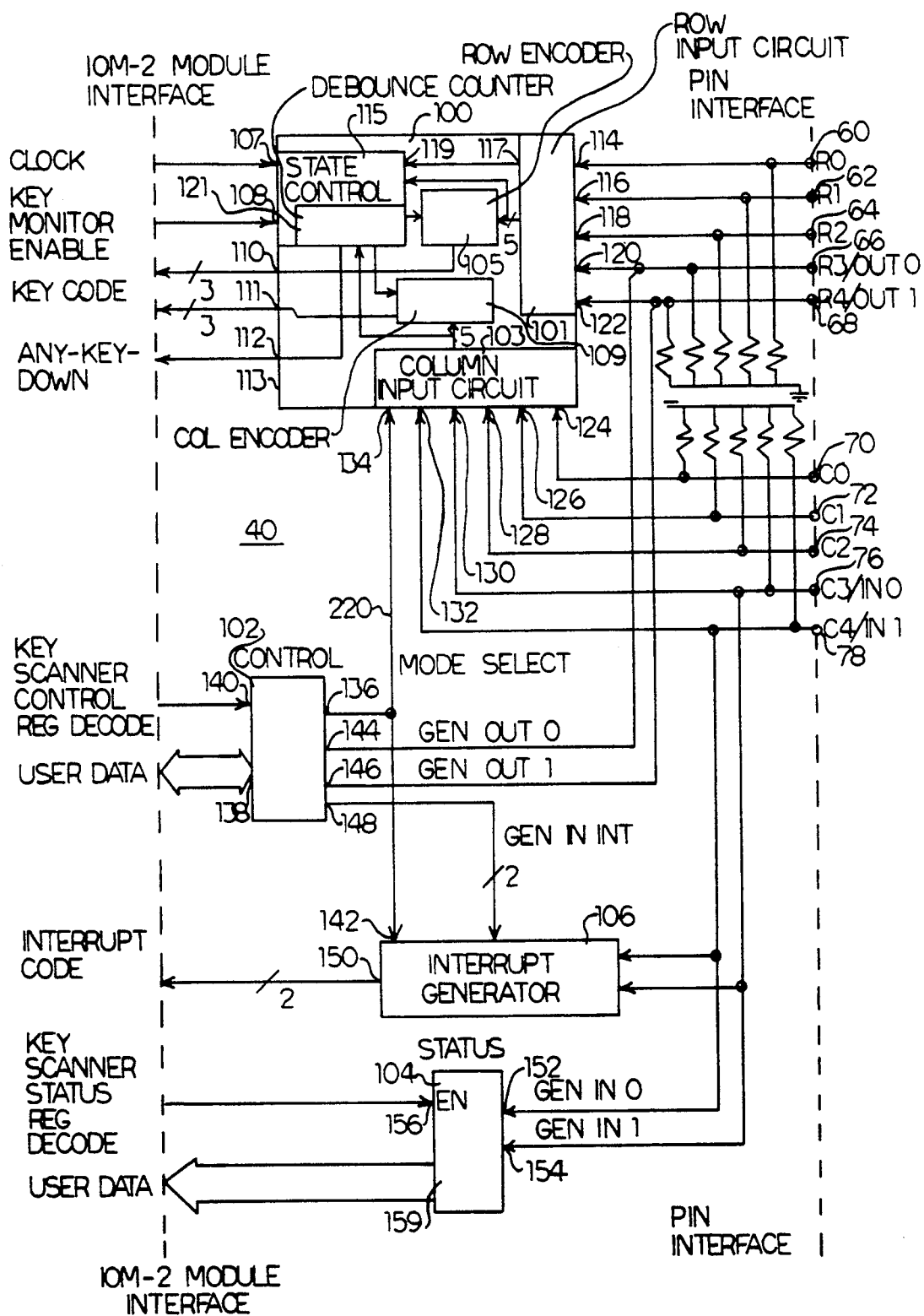
FIG. 3 is a block diagram of a keypad monitor embodying the present invention incorporated into the hands-free, multiple feature telephone unit of FIG. 2.

Referring now to FIG. 3, it illustrates the keypad monitor 40 in greater detail. The keypad monitor 40 generally includes monitor section 100, a control register 102, a status register 104, and an interrupt message generator 106.

The monitor section 100 includes a clock input 107 for receiving the DCL clock signals from the digital interface 44, a key monitor enable input 108 for receiving enable signals from the digital interface 44, outputs 110 and 111 for providing the shift register 45 of the digital interface 44 with the parallel three-bit row and column key codes respectively representing the keypad switch being closed and the predetermined six-bit error key code, and output 112 for providing the digital interface 44 with the aforementioned any key down indication.

The monitor section further includes a row input circuit 101, a column input circuit 103, a row encoder 105, a column encoder 109, and the state control 115. Lastly, the monitor section includes an input 134 which is coupled to the output 136 of the control register 102 which controls whether the keypad monitor 40 is in the first or second mode of operation.

The row input circuit 101 includes the first plurality of inputs 114, 116, 118, 120, and 122 which are coupled to terminal input pins 60, 62, 64, 66, and 68 respectively. Similarly, the column input circuit 103 includes the second plurality of inputs 124, 126, 128, 130, and 132 which are coupled to the input terminal pins 70, 72, 74, 76, and 78, respectively.

Before a depressed keypad switch may be identified with the six-bit key code; it is first necessary to activate the keypad monitor 40 and digital interface 44 through the generation of the any key down signal. To that end, the row input circuit 101 detects when any one of the keypad switches has closed to generate an output signal at an output 117 which is used in the generation of the any key down signal. The output 117 is coupled to an input 119 of the state control 115. The state control includes a clock detector (not shown) which is coupled to the input 107 of the monitor section to detect the presence and absence of the clock signals. In the absence of the clock signals, and in response to receiving the output signal from output 117 of the row input circuit 101, the state control 115 provides the any key down signal at output 112. As a result, the state control 115 generates the any key down signal at its output 112 when any one of the keypad switches is closed together with the absence of clock signals being received at input 107. The any key down signal provided at output 112 then causes the output 52 of the digital interface 44 to be pulled low momentarily to cause the digital controller to provide the clock signals from its clock source 15.

The clock signals provided by the clock source 15 of the digital controller 14 cause the digital interface 44 to be activated and also cause the state control 115 to enable the row and column encoders to scan their inputs to identify which one of the keypad keys is closed. To that end, the row input circuit 101 includes five outputs which are coupled to the row encoder 105 and the state control 115. Each of these outputs corresponds to a respective given one of the row conductors which are coupled to the keypad switches. The row input circuit 101 generates a first signal at those outputs which have corresponding row conductors coupled to a depressed keypad switch. Similarly, the column input circuit 103 includes five outputs which are coupled to the column encoder 109 and to the state control 115. Each of these outputs corresponds to a respective given one of the column conductors coupled to the keypad switches. The column input circuit 103 is arranged to generate a second signal at those outputs which have corresponding column conductors coupled to a closed keypad switch.

When enabled by the state control 115, the row encoder 105 and column encoder 109 scan their inputs for the first and second signals respectively. The row encoder responsive to a first signal at one of its inputs will generate the parallel three-bit row address for the corresponding row conductor which is coupled to the closed keypad switch. Similarly, the column encoder 109 upon detecting the second signal at one of its inputs, will generate the parallel three-bit column address for the column conductor which is coupled to the closed keypad switch. The parallel three-bit row and column addresses are conveyed to the outputs 110 and 111 respectively of the monitor section 100 and are conveyed in parallel to the shift register 45 of the digital interface 44 (FIG. 2) as previously described.

If two or more keypad switches are simultaneously depressed the state control 115 will detect the presence of more than one first signal from the row input circuit or more than one second signal from the column input circuit to generate the error key code over outputs 110 and 111 of the monitor section 100. In addition to generating the error key code, the state control 115 disables the row encoder 105 and column encoder 109 to preclude the generation of a parallel three-bit row and column address by the row encoder and the column encoder. The error key code provided at outputs 110 and 111 is conveyed to the shift register 45 of the digital interface 44 as previously described. As previously described, when the error key code is conveyed over the serial bus, the rest of the system will be advised that the entry is invalid and should be ignored.

When no key is depressed, and the row encoder and the column encoder are enabled by the state control to provide their respective addresses, the row encoder and column encoder will each provide a predetermined three-bit key code indicating a no key down condition. These parallel three-bit codes are conveyed to the shift register 45 of the digital interface 44 in the usual manner so as to be combined by the shift register and converted to serial bits of data indicating the no key down condition.

The state control 115 includes a debounce counter 121 which delays the reporting of the status of the keypad for a predetermined period of time after a key is depressed. As will be seen hereinafter, the debounce time period is set by incrementing the debounce counter a predetermined number of times prior to reporting the status of the keypad.

The control register 102 includes an input 138 for receiving programming data from the digital interface 44. The control register includes another input 140 for receiving the address of the control register to enable the control register to be properly programmed to set the keypad monitor into the first or second mode of operation. For example, when the first mode of operation is selected, the output 136 will provide a high level to input 134 of the monitor section and a high level to an input 142 of the interrupt generator 106. When the keypad monitor is to operate in the second mode, the control register 102 will provide at output 136 a low level to input 134 of the monitor section and to the input 142 of the interrupt generator 106.

The control register 102 includes another output 144 coupled to input 120 of the keypad monitor logic and an output 146 coupled to input 122 of the keypad monitor logic. These outputs, when the keypad monitor is operative in the second mode, provide a high logic level to the inputs 120 and 122 when these outputs are used for general outputs and thus enable the inputs 120 and 122 to be used as general outputs. In other words, when the keypad monitor 40 is to be used in the second mode and terminal pins 66 and 68 are converted for general output purposes, the inputs 120 and 122 are provided with a high TTL voltage level.

The control register includes a further output 148 which is coupled to the interrupt generator 106. The output 148 allows the interrupt generator 106 to be enabled when the keypad monitor is in the second mode of operation to permit the interrupt generator 106 to generate interrupt messages responsive to the input conditions at pins 76 and 78. If during the second mode of operation the input pins 76 and 78 are to be used for purposes other than to generate interrupt messages, the interrupt generator 106 would not be enabled by the output 148. The interrupt generator 106 has an output 150 for providing the generated interrupt messages. The output 150 is coupled to the digital interface 44 to convey the interrupt messages to the digital controller 14 and the microprocessor 16.

The status register 104 includes a pair of inputs 152 and 154 coupled to terminals 76 and 78 respectively. The status generator 104 also includes an input 156 for receiving its address and enabling the status register to provide status information as to the condition of pins 76 and 78 over an output 159. The output 159 is coupled to the digital interface 44 so that the status of the status register 104 may be read by the microprocessor 16.

Figure 4:
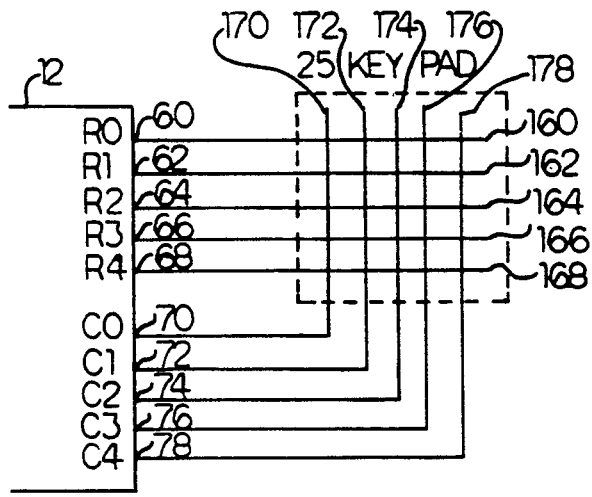
FIG. 4 is a simplified block diagram illustrating the keypad monitor of FIG. 3 when operating in a first mode.

Referring now to FIG. 4, it illustrates the manner in which the keypad monitor of the telephone unit 12 is coupled to a keypad comprising twenty-five keypad switches when operative in the first mode of operation. As will be noted in FIG. 4, each of the row input terminal pins 60, 62, 64, 66, and 68 is coupled to a row conductor 160, 162, 164, 166, and 168 respectively. Similarly, each column terminal input pin 70, 72, 74, 76, and 78 is coupled to a respective one of the column conductors 170, 172, 174, 176, and 178. As configured in this manner, the keypad monitor of the telephone unit 12 is capable of supporting a keypad having twenty-five keypad switches.

Figure 5:
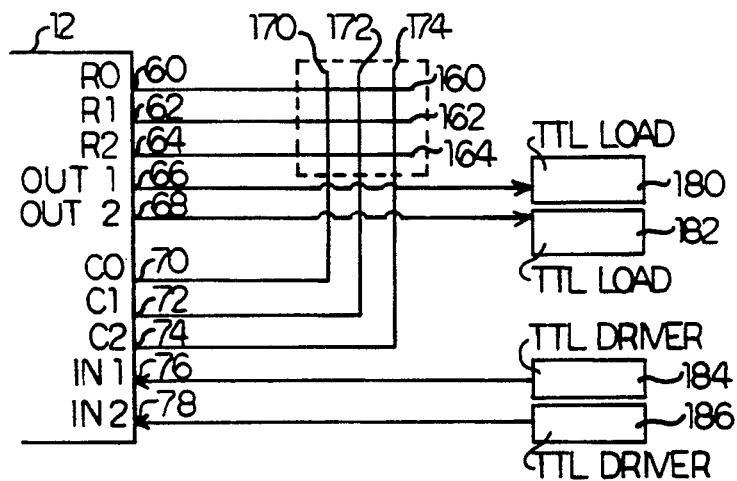
FIG. 5 is a simplified block diagram illustrating the keypad monitor of FIG. 3 when operating in a second mode.

Referring now to FIG. 5, it illustrates the manner in which the keypad monitor of the telephone unit 12 is coupled to a keypad comprising nine keypad switches when operative in the second mode of operation. It will be noted that in FIG. 5, each of the row terminal input pins 60, 62, and 64, is coupled to a respective one of the row conductors 160, 162, and 164. Similarly, each of the column input terminal pins 70, 72, and 74 is coupled to a respective one of the column conductors 170, 172, and 174. The terminal pins 66 and 68 are converted for general output purposes and are coupled to TTL loads 180 and 182. Pins 76 and 78 are coupled to TTL drivers 184 and 186 and thus serve as general purpose input pins. Hence, when the keypad monitor is rendered operative in the second mode, the third set of terminal pins including terminal pins 66 and 68 are converted for general output purposes, and terminal pins 76 and 78 are converted for general input purposes, not associated with the monitoring of the keypad.

Figure 6:
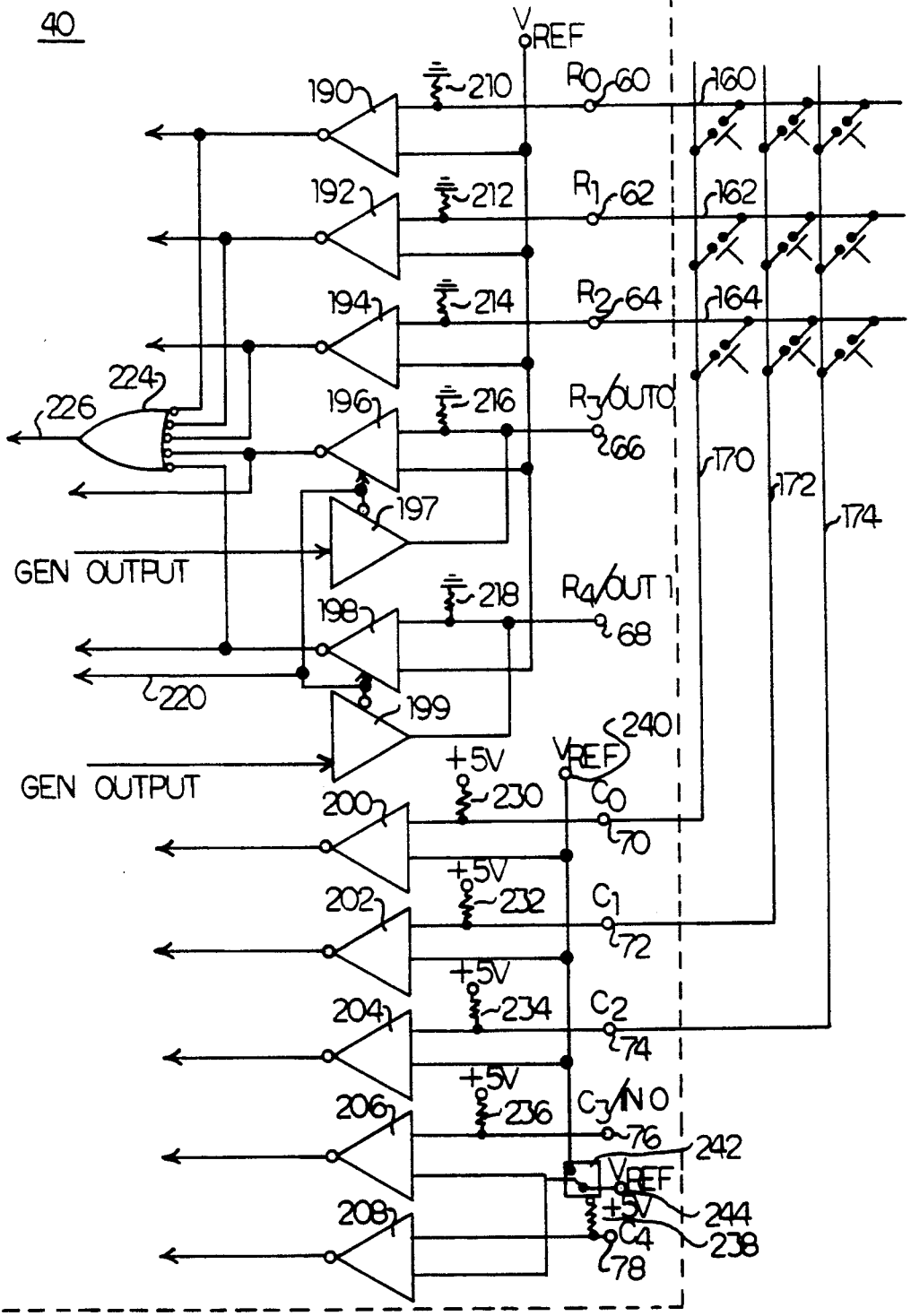
FIG. 6 is a schematic circuit diagram illustrating the circuitry of the keypad monitor of FIG. 3 which may be used for sensing the closure of any one of the keypad switches and providing first and second output signals responsive thereto for use in deriving a multiple-bit keypad switch address for identifying a particular keypad switch being selected.

Referring now to FIG. 6, it illustrates in greater detail the row input circuit 101 and the column input circuit 103. These circuits are illustrated when the keypad monitor is operative in the second mode of operation. The row input circuit 101 includes a plurality of sense amplifiers 190, 192, 194, 196, and 198, and the column input circuit 103 includes sense amplifiers 200, 202, 204, 206, and 208. The sense amplifiers 190, 192, and 194 include a first input coupled to the row conductors 160, 162, and 164 respectively and to ground potential through internal pull down resistors 210, 212, and 214 respectively. Sense amplifiers 196 and 198 also have a first input coupled to terminal pins 66 and 68 respectively and to ground potential through pull down resistors 216 and 218, respectively. In keeping with the second mode, it will be noted, that terminal pins 66 and 68 are not coupled to any row conductors.

Associated with sense amplifiers 196 and 198 are sense amplifiers 197 and 199 respectively. Sense amplifiers 197 and 199 each include an input which is coupled to a general purpose output for receiving a general purpose output signal. When the keypad monitor is rendered in the second mode, a logical zero is impressed upon mode select line 220 which is coupled to the output 136 of the control register 102 (FIG. 3) which disables sense amplifiers 196 and 198 and enables sense amplifiers 197 and 199. As a result, the terminal pins 66 and 68 are converted to general output pins for driving TTL loads 180 and 182 (FIG. 5).

It will also be noted that each of the sense amplifiers 190, 192, 194, 196, and 198 includes a second input which is coupled to a reference voltage at a terminal 222. The reference voltage is selected such that when one of the keypad switches is depressed or closed, a logical one first signal is provided at the output of the sense amplifier coupled to the row of the switch which has been depressed. It will also be noted that the outputs of the sense amplifiers are all coupled to an input of an OR gate 224. Hence, when one of the key switches of the keypad is depressed, OR gate 224 will provide at an output 117 the output signal previously described which is used to generate the any key down signal.

Sense amplifiers 200, 202, and 204 each include a first input which is coupled to one of the keypad column conductors 170, 172, and 174 and to a +5 volts through internal pull up resistors 230, 232, and 234. Sense amplifiers 206 and 208 also include a first input which is coupled to a +5 volts through an internal pull up resistor 236 and 238 and are also coupled to the column input terminal pins 76 and 78 which are not coupled to any column lines. Sense amplifiers 200, 202, and 204 have a second input coupled to a voltage reference at a terminal 240 which is equal to the reference voltage supplied at terminal 222. When a keypad switch is depressed, the sense amplifier coupled to the column line which is in turn coupled to the closed keypad switch will provide a second signal logical one output. A second signal logical one output of one of the column sense amplifiers 200, 202, and 204 and a first signal logical one output provided by one of the row sense amplifiers 190, 192, or 194 are sensed by the encoders 103 and 101 as they scan their inputs to generate their respective parallel three-bit codes indicating which keypad switch is closed. Of course, if the keypad monitor is operative in the first mode, sense amplifiers 196 and 198 would be coupled to two additional row conductors and sense amplifiers 206 and 208 would be coupled to two additional column conductors.

It will also be noted that sense amplifiers 206 and 208 include a second input coupled to a switch 242 which may be a solid state switch. One pole of the switch is coupled to the reference potential terminal 240 and the other pole of the switch is coupled to another reference potential terminal 244. When the keypad monitor is operative in the second mode, the low logic level on the mode select line 220 causes the switch 242 to select the reference potential at terminal 244. By doing so, the second inputs of the sense amplifiers 206 and 208 are coupled to a different reference potential for sensing high or low TTL levels at their respective first inputs coupled to terminals 76 and 78. In this manner, the terminals 76 and 78 are converted for general input purposes and are coupled to TTL drivers 184 and 186 as illustrated in FIG. 5.

Figure 7:
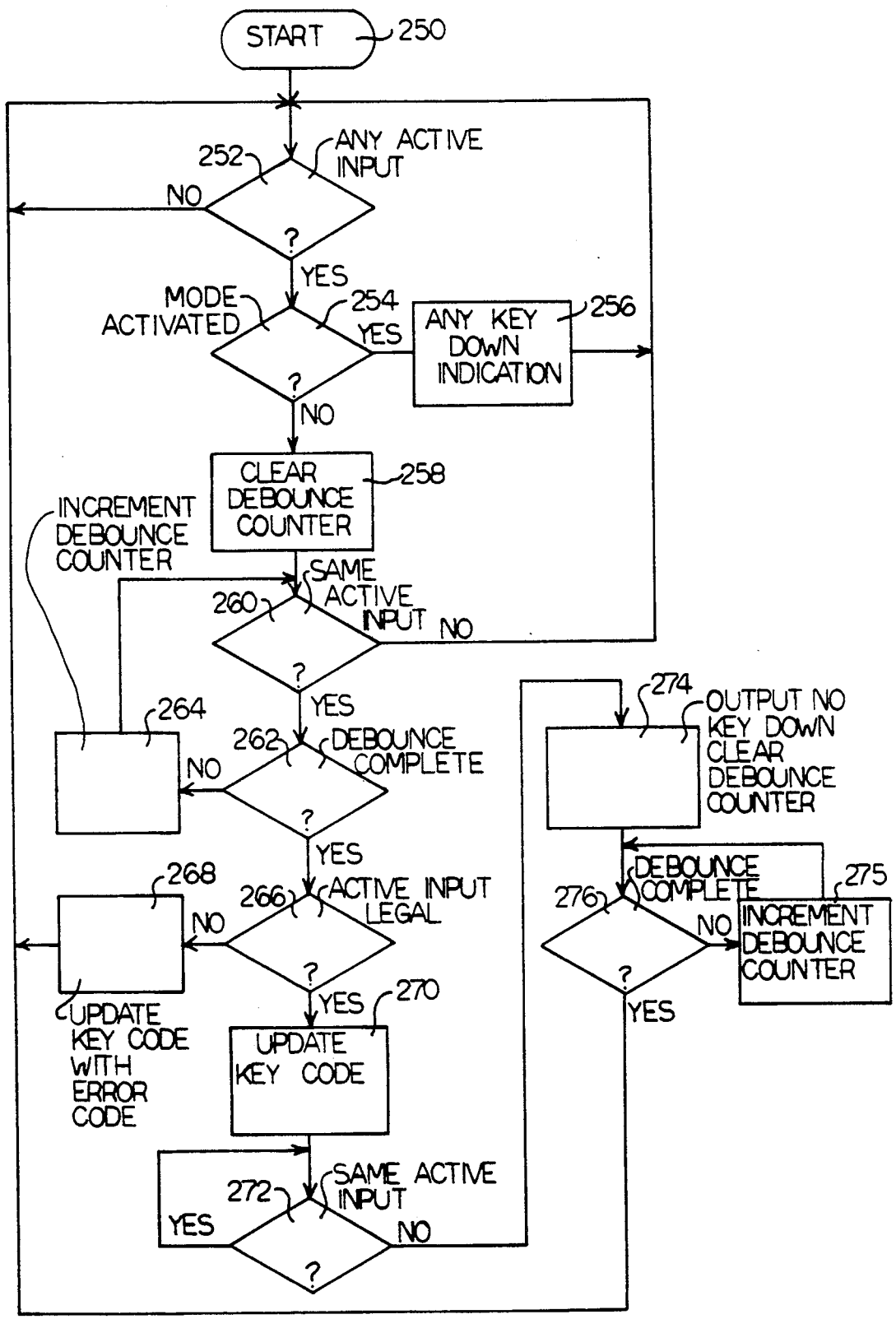
FIG. 7 is a flow diagram illustrating the manner in which the keypad monitor of FIG. 3 may be implemented for monitoring a plurality of keypad switches and reporting the status thereof in accordance with a preferred embodiment.

Referring now to FIG. 7, it illustrates the manner in which the state control 115 may be implemented for controlling the operation of the keypad monitor 40. The keypad monitor begins at start in step 250. It first determines in step 252 if any one of the keypad switches has been depressed. If not, the keypad monitor will return to start. If a keypad switch has been depressed, the keypad monitor then in step 254 determines if it is in the deactivated mode. It performs this step by the clock detector detecting the absence of the clock signals from the digital controller 14. If the keypad monitor is deactivated, then in step 256, it provides the any key down indication to be conveyed to the digital interface 44. This causes the digital controller 14 to provide clock pulses from its clock source 15 to the telephone unit 12 over the bus 32. The digital interface 44 and keypad monitor 40 are then activated and the keypad monitor then returns to start.

If the key is still depressed, the keypad monitor will sense that the key is depressed in step 252, and then determine in step 254 that it is not in the deactivated mode. Since the keypad monitor 40 is now activated, the key switch monitor 101 will now receive clock signals causing the encoders to scan their inputs.

The keypad monitor then clears the debounce counter in step 258. The debounce counter is provided to provide a delay time for the keypad switch being depressed to be stabilized and to dissipate any transients that may be occurring within the keypad.

The keypad monitor then in step 260 determines if the keypad switch currently depressed is the same active input as originally detected. If not, the keypad monitor returns to start. If it is the same active input, the keypad monitor then determines in step 262 if the debounce period has been completed. If not, the keypad monitor in step 264 increments the debounce counter and then returns to step 260. When the debounce counter is incremented a sufficient number of times to indicate that the debounce time period has been completed, the keypad monitor will detect in step 262 that the debounce time period has been completed and then proceeds to step 266 to determine if the active input is a legal input. If the active input is not legal, caused for example by two keys being simultaneously depressed, the keypad monitor, through the state control 115, the updates the keycode with the predetermined error key code in step 268. After providing the error key code, the keypad monitor returns to start.

If the active input is a legal input as determined in step 266, the keypad monitor proceeds to step 270 to enable the encoders 105 and 109 to update the key code. When updating the key code, the keypad monitor provides the six-bit key code of the particular key being depressed by providing the parallel three-bit row and column addresses.

After updating the key code, the keypad monitor then determines if the same key is still being depressed in step 272. The keypad monitor continuously repeats step 272 until the same key is no longer being depressed. When the key is no longer being depressed, the keypad monitor will output a six-bit code indicating that no key is being depressed. This no key down output is a predetermined six-bit code, and will clear the debounce counter in step 274. The keypad monitor then in step 276 determines if the debounce time period has completed. If not, the keypad monitor in step 278 increments the debounce counter and returns to step 276 to determine if the debounce time period has completed. Once the debounce time period has completed, the keypad monitor returns to start to detect the depression of another keypad switch.

Hence, from the foregoing, it can be seen that the keypad monitor provides a six-bit code indicating that no key is down, a six-bit code indicating an error when the input is illegal, a six-bit code indicating which keypad switch is depressed, and a separate indication of an any key down condition to cause the digital controller to provide clock signals to activate the interface 44 and the keypad monitor 40.

After receiving the clock signals from the digital controller 14, the keypad monitor then determines which key is depressed as described above. Before providing the six-bit code indicating the particular key being depressed, the keypad monitor provides a debounce time period and after the keypad switch is opened, the keypad monitor provides another debounce time period. If two keys are being depressed simultaneously, the keypad monitor generates a six-bit error key code to inform the microprocessor 16 that it should disregard the keypad switch closure. Also, when no key is depressed, the keypad monitor provides a six-bit no key down code to the interface 44.

All of the parallel six-bit codes are converted to serial data bits by the digital interface 44. The serial bits of data are placed into the proper channel when conveyed to the bus 32 for conveyance to the digital controller 14.

While a particular embodiment of the present invention has been shown and described, modifications may be made, and it is therefore intended to cover in the appended claims all such changes and modifications which fall within the true spirit and scope of the invention.

What is claimed is:

1. A keypad status reporting system for providing an indication over a serial bus of a selected keypad switch of a plurality of keypad switches which is being selected by an operator, wherein said plurality of keypad switches is coupled between a plurality of first conductors and a plurality of second conductors, and wherein each keypad switch of said plurality of keypad switches is coupled between a respective different pair of one of said plurality of first conductors and one of said plurality of second conductors, said system comprising:

first input circuit means coupled to said plurality of first conductors for providing a first signal indicating which one of said first plurality of conductors is coupled to said selected keypad switch;

second input circuit means coupled to said second plurality of conductors for providing a second signal indicating which one of said second plurality of conductors is coupled to said selected keypad switch;

encoding means coupled to said first and second input circuit means for providing a unique parallel multiple-bit digital key code indicating which one of said plurality of keypad switches is being selected;

parallel to serial conversion means coupled to said serial bus and to said encoding means for converting said parallel multiple-bit digital key code to serial bits of data and conveying said serial bits of data to said serial bus; and control means for enabling said encoding means and being coupled to said first and second input circuit means for disabling said encoding means and generating an error signal when two or more of said plurality of keypad switches are simultaneously selected.

2. A system as defined in claim 1 wherein said parallel to serial conversion means is responsive to an enable signal for placing said serial bits of data into a predetermined channel.

3. A system as defined in claim 1 wherein said encoding means comprises a first encoder coupled to said first input circuit means for generating a first key code portion of said multiple-bit key code responsive to said first signal.

4. A system as defined in claim 3 wherein said encoding means comprises a second encoder coupled to said second input circuit means for generating the remaining key code portion of said multiple-bit key code responsive to said second signal.

5. A system as defined in claim 4 wherein said parallel to serial conversion means is arranged for combining said first and remaining key code portions to form said multiple-bit key code prior to converting said multiple-bit key code to said serial bits of data.

6. A system as defined in claim 5 wherein said multiple-bit key code comprises six bits, wherein said first key code portion comprises three bits and wherein said remaining key code portion comprises three bits.

7. A system as defined in claim 1 wherein said control means are coupled to said parallel to serial conversion means, wherein said error signal comprises a parallel multiple-bit error code, and wherein said conversion means is arranged for converting said multiple-bit error code to serial bits of data.

8. A system as defined in claim 1 wherein said encoding means are arranged for generating a predetermined parallel multiple-bit code in the absence of said first and second signals indicating the absence of a keypad switch selection.

9. A system as defined in claim 8 wherein said predetermined parallel multiple-bit code comprises six bits.

10. A system as defined in claim 1 wherein said conversion means comprises a parallel input-serial output shift register.

11. A system as defined in claim 1 wherein said parallel multiple-bit key code comprises six bits.

12. A keypad status reporting system for providing an indication over a serial bus of a selected switch of a plurality of keypad switches which is being selected by an operator, wherein each said keypad switch of said plurality of keypad switches is coupled between a respective different pair of a plurality of row and column conductors, and wherein said system is implemented in integrated circuit form and comprises:

row input circuit means coupled to said plurality of row conductors for providing a first signal indicating which of said row conductors is coupled to said selected keypad switch;

column input circuit means coupled to said plurality of column conductors for providing a second signal indicating which one of said column conductors is coupled to said selected keypad switch;

row encoding means coupled to said row input circuit means for generating a parallel multiple-bit row address responsive to said first signal;

column encoding means coupled to said column input circuit means for generating a parallel multiple-bit column address responsive to said second signal; and parallel to serial conversion means coupled to said row encoding means and said column encoding means for combining said row and column addresses to form a parallel multiple-bit key code, said parallel to serial conversion means also being coupled to said serial bus and being arranged for converting said parallel multiple-bit key code to serial bits of data and conveying said serial bits of data to said serial bus; and control means for enabling said row and column encoding means and being coupled to said row and column input circuit means for disabling said row and column encoding means and generating an error signal when two or more of said keypad switches are simultaneously selected.

13. A system as defined in claim 12 wherein said parallel to serial conversion means is responsive to an enable signal for placing said serial bits of data into a predetermined channel.

14. A system as defined in claim 12 wherein said multiple-bit key code comprises six bits, wherein said parallel multiple-bit row address comprises three bits and wherein said parallel multiple-bit column address comprises three bits.

15. A system as defined in claim 12 wherein said control means are coupled to said parallel to serial conversion means and wherein said parallel to serial conversion means is arranged for generating a predetermined multiple-bit error code responsive to said error signal.

16. A system as defined in claim 12 wherein said row and column encoding means are arranged for generating a predetermined parallel multiple-bit code in the absence of said first and second signals indicating the absence of a keypad switch selection.

17. A system as defined in claim 16 wherein said predetermined parallel multiple-bit code comprises six bits.

18. A system as defined in claim 12 wherein said parallel to serial conversion means comprises a parallel input-serial output shift register.

19. A keypad status reporting system implemented in a single integrated circuit for providing an indication over a multiplexed bus as to which switch of a plurality of keypad switches is being selected by an operator, wherein each keypad switch of said plurality of keypad switches is coupled between a respective different pair of a plurality of first and second conductors, said system comprising:

monitor means coupled to said plurality of first and second conductors for providing first and second signals indicative of a selected keypad switch;

encoding means coupled to said monitor means for generating a unique parallel multiple-bit address responsive to said first and second signals; and parallel to serial conversion means coupled to said encoding means for converting said parallel multiple-bit address to corresponding serial bits of data, said parallel to serial conversion means also including an enable input and being responsive to an enable signal at said enable input for placing said serial bits of data into a predetermined channel of said multiplexed bus; and control means for enabling said row and column encoding means and being coupled to said row and column input circuit means for disabling said row and column encoding means and generating an error signal when two or more of said keypad switches are simultaneously selected.

* * * * *